United States Patent
Singh et al.

(10) Patent No.: US 9,000,963 B2
(45) Date of Patent: Apr. 7, 2015

(54) CIRCUIT AND METHOD FOR SKEW CORRECTION

(71) Applicants: STMicroelectronics SA, Montrouge (FR); STMicroelectronics International N.V., Amsterdam (NL)

(72) Inventors: Pratap Narayan Singh, Chahania Chanduli (IN); Stéphane Le Tual, Saint Egreve (FR)

(73) Assignees: STMicroelectronics SA, Montrouge (FR); STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 14/293,119

(22) Filed: Jun. 2, 2014

(65) Prior Publication Data

US 2014/0361914 A1 Dec. 11, 2014

(30) Foreign Application Priority Data

Jun. 7, 2013 (FR) ...................................... 13 55253

(51) Int. Cl.
| | |
|---|---|
| *H03M 1/00* | (2006.01) |
| *H03K 17/22* | (2006.01) |
| *H03M 1/12* | (2006.01) |
| *H03K 17/14* | (2006.01) |
| *H03K 17/687* | (2006.01) |

(52) U.S. Cl.
CPC ............... *H03K 17/223* (2013.01); *H03M 1/12* (2013.01); *H03K 17/145* (2013.01); *H03K 17/687* (2013.01); *H03K 2217/0018* (2013.01)

(58) Field of Classification Search
USPC ............... 341/155, 136, 122; 327/94
See application file for complete search history.

(56) References Cited

U.S. PATENT DOCUMENTS

| | | | |
|---|---|---|---|
| 4,308,468 A | 12/1981 | Olson | |
| 4,862,016 A | 8/1989 | Genrich | |
| 7,645,654 B2 * | 1/2010 | Vora ............................... | 438/195 |
| 7,772,647 B2 * | 8/2010 | Anderson et al. ............. | 257/348 |
| 7,772,649 B2 * | 8/2010 | Cheng et al. .................. | 257/354 |
| 7,808,408 B2 | 10/2010 | Madisetti et al. | |
| 8,269,528 B2 | 9/2012 | Payne et al. | |
| 8,507,989 B2 * | 8/2013 | Khakifirooz et al. ......... | 257/347 |
| 2003/0052717 A1 * | 3/2003 | Kakitani ......................... | 327/94 |
| 2010/0253414 A1 | 10/2010 | Dedic et al. | |

FOREIGN PATENT DOCUMENTS

| | | |
|---|---|---|
| FR | 3006833 A1 | 12/2014 |
| WO | 96/02087 A1 | 1/1996 |

OTHER PUBLICATIONS

Stepanovic et al., "A 2.8 GS/s 44.6 mW Time-Interleaved ADC Achieving 50.9 dB SNDR and 3 dB Effective Resolution Bandwidth of 1.5 GHz in 65 nm CMOS," IEEE Journal of Solid State Circuits, vol. 48, No. 4, Apr. 2013, pp. 971-982.

* cited by examiner

*Primary Examiner* — Brian Young
(74) *Attorney, Agent, or Firm* — Allen, Dyer, Doppelt, Milbrath & Gilchrist, P.A.

(57) ABSTRACT

The invention concerns a circuit comprising: a first transistor (102) having first and second main current nodes, and a gate node adapted to receive a first timing signal (CLK) for causing the first transistor to transition between conducting and non-conducting states; a biasing circuit (108) coupled to a further node of said first transistor; and a control circuit (110) adapted to control said biasing circuit to apply a first control voltage ($V_{CTRL}$) to said further node to adjust the timing of at least one of said transitions.

19 Claims, 3 Drawing Sheets

CIRCUIT AND METHOD FOR SKEW CORRECTION

CROSS REFERENCE TO RELATED APPLICATION

This application claims the priority benefit of French Patent Application number 13/55253, filed on Jun. 7, 2013, entitled "Circuit et procédéde correction de décalage temporel", the contents of which is hereby incorporated by reference in its entirety to the maximum extent allowable by law.

FIELD

The present application relates to a circuit and method for skew correction.

BACKGROUND

In the fields of signal sampling and other high frequency applications, timing signals of up to 10 GHz or more are often used to control switches or other circuit elements. In such applications, it is generally desirable to avoid any skew, in other words timing mismatch, between the timing signals, which can result in the addition of unacceptable spurs.

One example is sampling circuitry, such as track and hold circuits, of a time-interleaved analog to digital converter (ADC). In such an ADC, a number of ADC cores are arranged in parallel, each having an input coupled to a corresponding track and hold circuit controlled by a clock signal to store an input signal at a given time instant. The clock signal of each track and hold circuit is offset with respect to the others such that the overall sampling rate applied to the input signal is higher than that of each clock signal.

In some applications the presence of skew between clock signals can be detected and corrected by feedback circuitry.

However, a problem with existing solutions for correcting skew is that they tend to add noise in the form of jitter to the clock signal, which is undesirable. There is thus a need in the art for a solution without such a problem.

SUMMARY

It is an aim of embodiments of the present disclosure to at least partially address one or more needs in the prior art.

According to one aspect, there is provided a circuit comprising: a first transistor having first and second main current nodes, and a gate node adapted to receive a first timing signal for causing the first transistor to transition between conducting and non-conducting states; a biasing circuit coupled to a further node of said first transistor; and a control circuit adapted to control said biasing circuit to apply a first control voltage to said further node to adjust the timing of at least one of said transitions.

According to one embodiment, the first transistor has an SOI structure, and wherein said further node is coupled to a back gate of said first transistor.

According to one embodiment, the first transistor comprises a semiconductor layer isolated from said back gate by a layer of insulator.

According to one embodiment, the first transistor is a bulk transistor and said further node is a bulk node.

According to one embodiment, the first transistor forms part of a track and hold circuit further comprising a capacitor, the first transistor having a first main current node coupled to an input node of the track and hold circuit, and a second main current node coupled to said capacitor.

According to one embodiment, the circuit further comprises a second transistor having first and second main current nodes, and a gate node adapted to receive a second timing signal for causing the second transistor to transition between conducting and non-conducting states, wherein the first and second timing signals are differential signals, and wherein said biasing circuit is further coupled to a further node of said second transistor, and wherein said control circuit is further adapted to control said biasing circuit to apply a second control voltage to said further node of said second transistor to adjust the timing of at least one of the transitions of the second transistor.

According to one embodiment, the first main current nodes of said first and second transistors are coupled to a current source, and the circuit further comprises a third transistor having a first main current node coupled to a second main current node of the first transistor and a control node coupled to a second main current node of the second transistor, the control node of said third transistor further receiving an input signal to be sampled.

According to one embodiment, the circuit further comprises: a fourth transistor having a first main current node coupled to a first voltage signal, a control node coupled to a second voltage signal and a second main current node coupled to an output node of the circuit; a fifth transistor having a first main current node coupled to a third voltage signal, a control node coupled to a fourth voltage signal and a second main current node coupled to said output node of the circuit; and circuitry comprising said first and second transistors adapted to generate said first and second voltage signals, wherein said first and second voltage signals are both referenced to a first supply voltage and wherein said third and fourth voltage signals are both referenced to a second supply voltage.

According to one embodiment, the circuitry is adapted to: generate said first voltage signal by offsetting said first supply voltage by an amount determined by relative levels of first and second timing signals; and generate said second voltage signal by offsetting said first supply voltage by an amount determined by the relative levels of said first and second timing signals.

According to one embodiment, the circuitry comprises: a first branch generating said first voltage signal and comprising a resistor coupled to said first supply voltage and in series with said first transistor; and a second branch generating said second voltage signal and comprising a resistor coupled to said first supply voltage and in series with said second transistor.

According to one embodiment, each of said first and second timing signals has a voltage swing of less than 0.6 V.

According to one embodiment, each of said first and second timing signals has a first voltage swing, and wherein an output signal generated at said output node has a second voltage swing higher than said first voltage swing.

According to a further aspect, there is provided a time-interleaved analog to digital converter comprising a plurality of track and hold circuits each comprising the above circuit, and a plurality of converter blocks.

According to one embodiment, the time-interleaved analog to digital converter further comprises a skew estimation block adapted to receive digital values from said plurality of converter blocks and to generate said first control voltage of each track and hold circuit based on an analysis of said digital values.

According to a further aspect, there is provided a method of modifying the timing of at least one of transitions between conducting and non-conducting states of a first transistor having first and second main current nodes, a gate node, and a further node, the method comprising: applying to the gate node of said first transistor a first timing signal for causing the first transistor to transition between conducting and non-conducting states; and controlling, by a control circuit, a biasing circuit to apply a first control voltage to said further node to adjust the timing of at least one of said transitions of the first transistor.

BRIEF DESCRIPTION OF THE DRAWINGS

The foregoing and other features and benefits will become apparent from the following detailed description of embodiments, given by way of illustration and not limitation with reference to the accompanying drawings, in which.

DETAILED DESCRIPTION

The U.S. Pat. No. 7,808,408 describes a method of skew correction in which a master clock signal is corrected by a skew adjustment block based on a feedback signal generated by a correction estimator.

The publication entitled "A 2.8GS/s 44.6 mW Time-Interleaved ADC Achieving 50.9 dB SNDR and 3 dB Effective Resolution Bandwidth of 1.5 GHz in 65 nm CMOS", Dusan Stepanovic et al., describes a technique in which a least-mean-square algorithm is used to estimate, among other things, timing mismatches, which can then be corrected by an analog part.

In order to perform skew adjustment of a clock signal, both of the above solutions rely on intercepting and adjusting the timing signal before it reaches the circuitry to be controlled. However, doing so risks adding noise in the form of jitter to the clock signal, which is undesirable.

Figures 1A, 1B:
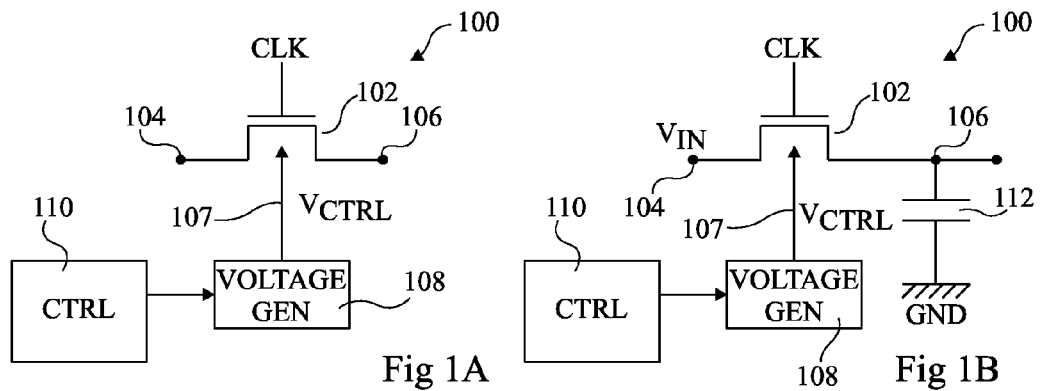
FIG. 1A schematically illustrates a circuit according to an example embodiment of the present disclosure.
FIG. 1B schematically illustrates a track and hold circuit according to a further example embodiment of the present disclosure.

FIG. 1A illustrates a circuit 100 comprising a transistor 102, which in this example is an NMOS transistor, but which in alternative embodiments could be a PMOS transistor or another type of transistor.

The transistor 102 has main current nodes, for example source and drain nodes, coupled to nodes 104 and 106 of the circuit. The circuitry coupled to these nodes 104 and 106 is not illustrated in FIG. 1A, but certain examples of such circuitry will be described herein after. A gate node of transistor 102 receives a timing signal CLK. As is well-known in the art, the timing signal CLK alternates between two voltage levels, one of which activates transistor 102 to provide a conduction path between the nodes 104 and 106, and the other of which renders the transistor 102 non-conducting, such that node 106 is disconnected from node 104.

Transistor 102 also comprises a further node 107, which receives a control voltage $V_{CTRL}$. For example, transistor 102 has a bulk structure and the further node 107 is a bulk node. Alternatively, transistor 102 has an SOI (semiconductor on insulator) structure, and the further node 107 is a back gate of the transistor 102.

The control voltage $V_{CTRL}$ is for example generated by a voltage generation block 108, based on a control signal from a control block 110. For example, the voltage generation block 108 comprises means for biasing the further node 107 of transistor 102, which may include a digital to analog converter, charge pump and/or other circuitry suitable for generating the control voltage.

The control block 110 for example comprises a memory storing one or more values indicating the control voltage $V_{CTRL}$ to be applied to the further node 107 of transistor 102. The control block 110 may additionally or alternatively receive one or more input signals, such as a feedback signal, based on which the control signal to the voltage generation block 108 is generated. For example, in some embodiments the control block 110 is implemented in a similar fashion to the correction estimator described in U.S. Pat. No. 7,808,408, and the contents of that application is hereby incorporated by reference in its entirety to the extent allowable by the law. Alternatively, the control block 110 is implemented in a similar fashion to the timing least-mean-square block described in the above-mentioned publication by Dusan Stepanovic, the contents of which is also hereby incorporated by reference in its entirety to the extent allowable by the law.

FIG. 1B illustrates the circuit 100 in the particular case that the circuit is a track and hold circuit, the node 104 receiving an input voltage $V_{IN}$, and the node 106 being coupled to ground via a capacitor 112.

Operation of the circuit 100 of FIGS. 1A and 1B will now be described with reference to FIG. 2.

Figure 2:
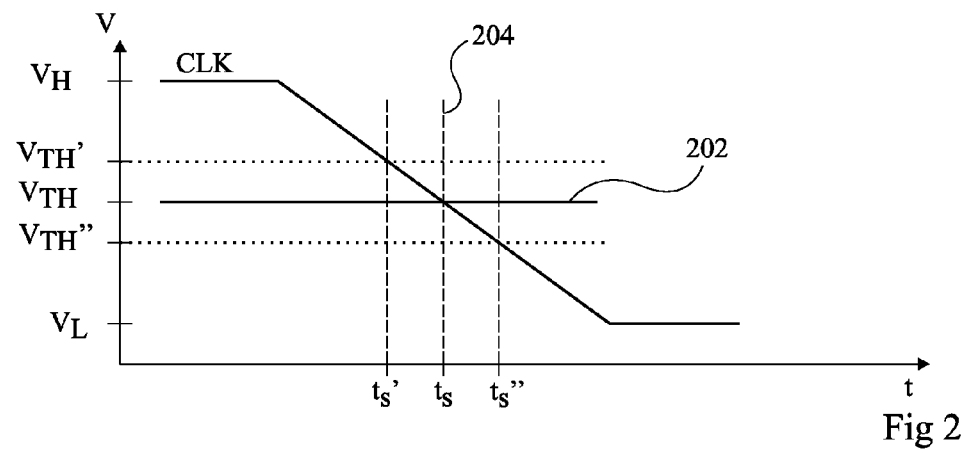
FIG. 2 is a graph showing an example of a signal transition in the circuit of FIG. 1A or 1B.

FIG. 2 is a graph illustrating a transition of the timing signal CLK of FIGS. 1A and 1B from a high state $V_H$ to a low state $V_L$. For example, the high state $V_H$ corresponds to a voltage level at or close to the supply voltage VDD, and is for example at between 0.8 and 2.5 V. The low state $V_L$ for example corresponds to a voltage level at or close to the ground voltage GND, and is for example at between 0 and 0.2 V.

For example, such a clock transition has the effect of rendering the transistor 102 non-conducting. In the case of the track and hold circuit of FIG. 1B, such a transition is for example used to isolate the voltage stored on capacitor from the input node 104, such that the input voltage signal $V_{IN}$ is sampled at this time instant and held on the capacitor 112.

As illustrated in FIG. 2, during the falling edge of the timing signal CLK, the voltage at the gate of transistor 102 for example falls relatively linearly with time until it reaches the low voltage level $V_L$. The transistor 102 is rendered non-conductive at the moment that a threshold level $V_{TH}$, shown by a line 202, is passed. The threshold level $V_{TH}$ is for example at a level of between 0.2 and 0.8, depending on the particular transistor technology applied. As shown by a dashed line 204 in FIG. 2, the time instant that the signal CLK falls below the threshold voltage $V_{TH}$ corresponds to a sampling time instant $t_s$ at which the transistor becomes non-conducting.

Furthermore, by modifying the voltage applied to the further node 107 of transistor 102, the threshold voltage can also be adjusted.

In one example, the transistor 102 is an NMOS transistor, for example with a bulk or SOI structure, and the threshold voltage $V_{TH}$ is at 0.5 V corresponding to a control signal $V_{CTRL}$ of 0 V. By reducing this control voltage, the threshold voltage can be increased. For example, if the control signal $V_{CTRL}$ is reduced to a level of −1 V, the threshold voltage is for example increased to a level of $V_{TH'}$ shown in FIG. 1, which is for example at 0.6 V, and thus the new sampling time becomes $t_{s'}$, which is earlier than $t_s$. Alternatively, by increasing the control signal $V_{CTRL}$, the threshold voltage can be decreased. For example, if the control signal $V_{CTRL}$ is increased to a level of 1 V, the threshold voltage is for example reduced to a level of $V_{TH''}$ shown in FIG. 1, which is for example at 0.4 V, and thus the new sampling time becomes $t_{s''}$, which is later than $t_s$.

In another example, the transistor 102 is a PMOS transistor, for example with a bulk or SOI structure, and the threshold voltage can be increased or decreased by the opposite adjustments to the control voltage described above.

The time shift for a given change in the control voltage $V_{CTRL}$ will depend on various factors, such as the type and dimensions of the transistor 102 and the slope of the falling or rising edge of the timing signal CLK.

In one example, a period of the timing signal CLK is of around 100 ps, the rise time and fall time of the clock edges are around 10 ps, and the voltage adjustment at the further node 107 permits a time shift of the time $t_s$ by up to ±1 ps.

Figure 3A:
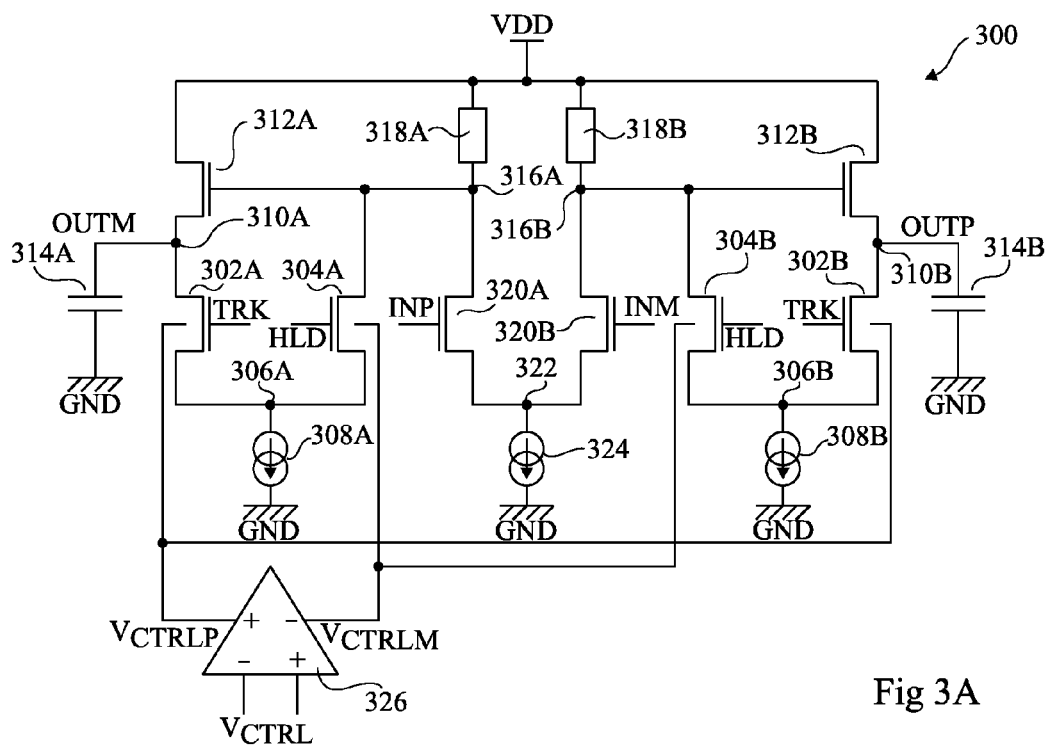
FIG. 3A schematically illustrates a circuit according to a further example embodiment of the present disclosure.

FIG. 3A schematically illustrates a track and hold circuit 300 according to an example embodiment. The circuit 300 is a differential implementation in which a differential value of input signals INP and INM is sampled. A left-hand circuit portion in FIG. 3A comprises a pair of transistors 302A, 304A, each of which is for example an NMOS transistor. Transistor 302A has its gate coupled to receive a track signal TRK, and transistor 304A has its gate coupled to receive a hold signal HLD. One of the main current nodes of transistors 302A and 304A, for example their source node, is connected to a node 306A, which is in turn coupled to ground via a current source 308A. A second main current node of transistor 302A, for example its drain, is coupled to a node 310A, which is in turn coupled to the supply voltage VDD via the main current nodes of a transistor 312A, which is for example an NMOS transistor. Node 310A is further coupled to ground via a capacitor 314A, and provides one of the output signals OUTM of the track and hold circuit. The gate of transistor 312A and the second main current node of transistor 304A, for example its drain, are coupled to a node 316A. Node 316A is coupled to the supply voltage VDD via a resistor 318A, and to a further node 322 via the main current nodes of a transistor 320A, which is for example an NMOS transistor receiving the input signal INP at its gate node. The node 322 is for example coupled to ground via a current source 324.

The right-hand circuit portion in FIG. 3 is for example identical to the left-hand portion, and its components are referenced with the same reference numerals, except that the letter A is replaced by a B. The transistors 302B, 304B for example receive the same track and hold signals TRK, HLD as the corresponding transistors 302A, 304A in the left-hand portion. The node 310B provides an output signal OUTP of the track and hold circuit.

The transistors 302A and 302B each have a further node, which could be a bulk node or a back gate node, connected to a positive output of a differential amplifier 326 for receiving a control voltage $V_{CTRLP}$. The transistors 304A and 304B each have a further node, which could be a bulk node or a back gate node, connected to a negative output of the differential amplifier 326 for receiving a control voltage $V_{CTRLM}$. The differential amplifier 326 for example generates the differential control voltages $V_{CTRLP}$ and $V_{CTRLM}$ based on a control voltage $V_{CTRL}$ applied across its positive and negative input terminals. While not illustrated in FIG. 3A, the control voltage $V_{CTRL}$ is for example generated by circuitry similar to the voltage generation circuitry 108 and control block 110 of FIGS. 1A and 1B.

In operation, the nodes 316A and 316B have voltage signals based on the relative levels of the differential input signals INP and INM. In particular, the amount of the current of the current source 324 that is directed through the branch of transistor 320A and resistor 318A, and the amount that is directed through the branch of transistor 320B and resistor 318B, is a function of the relative levels of INP and INM, and the size of the transistors 320A, 320B. The voltage across the resistors 318A and 318B will depend on these current levels. Furthermore, the track and hold signals TRK, HLD are differential timing signals. When the track signal TCK is high and the hold signal HLD low, the current of current sources 308A, 308B is directed through the transistors 302A, 312A and 302B, 312B respectively. Thus the voltages at nodes 310A, 310B seen by capacitors 314A and 314B follow the voltages at nodes 316A and 316B respectively. When the track signal TCK goes low and the hold signal HLD goes high, the current of current sources 308A, 308B will be directed through transistors 304A and 304B respectively. The gate source voltages VGS of transistors 312A and 312B thus become negative such that the voltages at nodes 310A, 310B no longer follow the voltages at nodes 316A, 316B, and the capacitors 314A, 314B hold their voltage levels.

The sampling time of the circuit 300 is thus determined by the crossing point of the track and hold signals, and this time can be adjusted by the control voltages $V_{CTRLP}$ and $V_{CTRLM}$, as will now be described with reference to FIG. 3B.

Figure 3B:
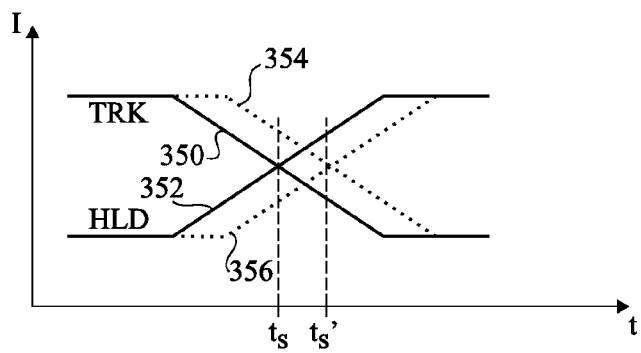
FIG. 3B is a graph showing an example of a signal transition in the circuit of FIG. 3A.

FIG. 3B is a graph illustrating, with a solid line 350, the current generated through the transistors 302A and 302B during a falling edge of the track signal TRK, and by another solid line 352, the current generated through transistors 304A and 304B during a rising edge of the hold signal HLD. As illustrated, the crossing point between a falling edge of line 350 and the rising edge of line 352 determines the sampling time $t_s$.

Furthermore, the graph in FIG. 3B illustrates, with a dotted line 354, the current generated through the transistors 302A and 302B during a falling edge of the track signal TRK when a positive control voltage VCTRLP is applied to the further node of these transistors. FIG. 3B also illustrates, with another dotted line 356, the current generated through transistors 304A and 304B during a rising edge of the hold signal HLD when a negative control voltage $V_{CTRLM}$ is applied to the further node of these transistors.

The control voltages $V_{CTRLP}$ and $V_{CTRLM}$ in the example of FIG. 3B have the effect of lowering the threshold voltage of transistors 302A, 302B and raising the threshold voltage of transistors 304A, 304B, such that the new crossing point between the current levels is at a time $t_{s'}$ later than the time $t_s$. It will be apparent to those skilled in the art that the sampling time could equally be brought forward by a negative value of the control voltage $V_{CTRLP}$ and a positive value of the control voltage $V_{CTRLM}$.

Rather than the differential implementation of FIG. 3A, a single-ended implementation could be based on the same track and hold circuit of FIG. 3A, for example using only the transistors 302A, 304A, 312A, current source 308A, capacitor 314A, resistance 318A and differential amplifier 326. In such an implementation, the signal to be sampled is for example applied as a current directly to the node 316A.

Figure 4:
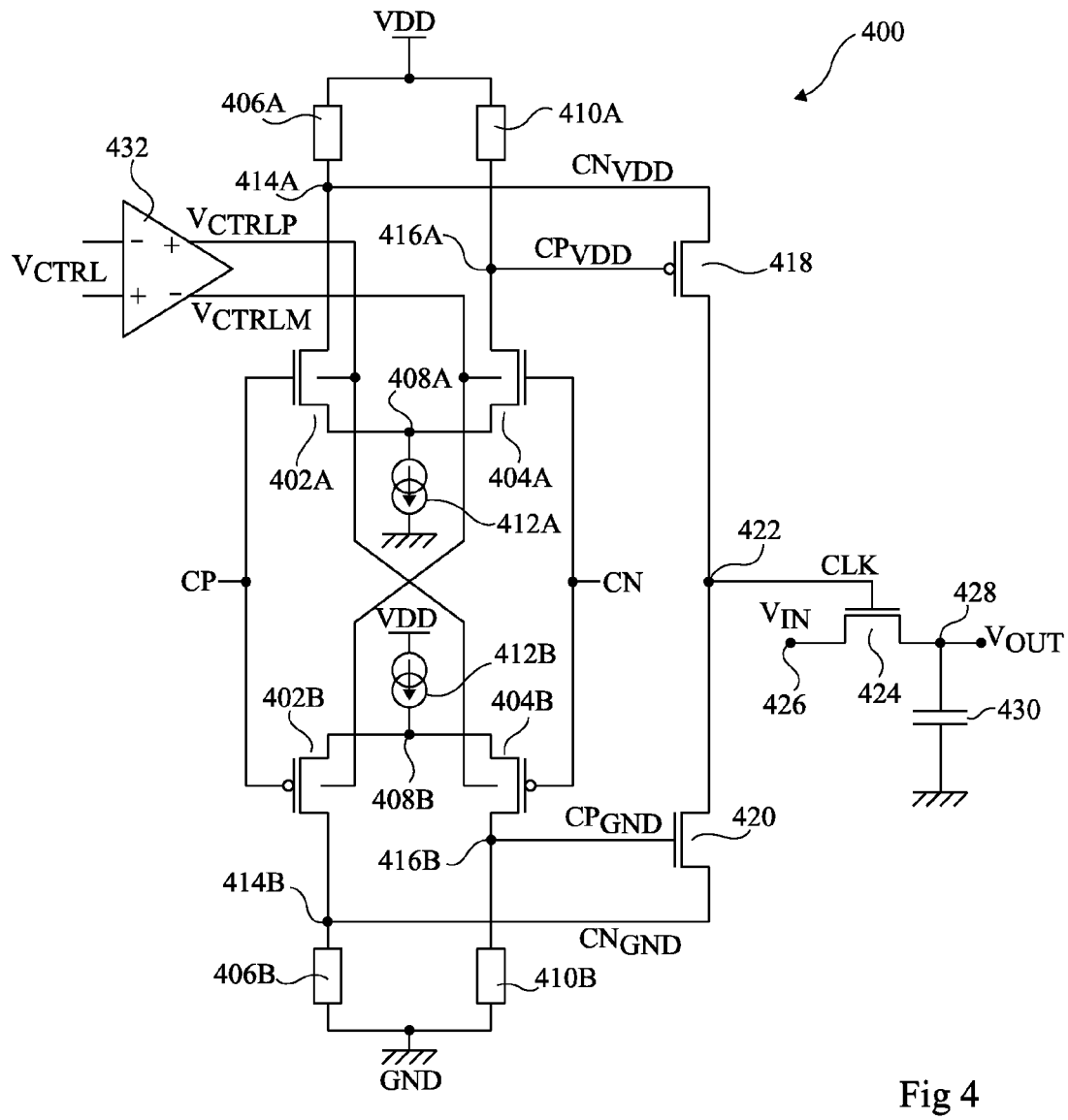
FIG. 4 schematically illustrates a circuit according to a further example embodiment of the present disclosure.

FIG. 4 schematically illustrates a circuit 400 according to a further embodiment. As will be described in more detail below, circuit 400 converts a pair of differential input signals CP, CN into a single-ended timing signal CLK, and in particular converts a voltage swing of each of the differential signals, which is for example relatively low, into a voltage swing adapted to the transistors to be controlled. For example, the differential signals CP, CN are low noise signals each having a voltage swing equal to 0.6 V or less. A typical voltage swing of these signals would be around 0.4 V, but in some cases it could be as low as 0.15 V. Such signals are for example provided by CML (current mode logic) elements, which enable high frequency signals, for example of up to 10 GHz or more, to be transmitted across an integrated circuit. A circuit similar to the circuit of FIG. 4 is described in another French patent application No. 1355251 filed on Jun. 7, 2013 in the name of the same applicants and having the same inventors as the present case, the contents of which is hereby incorporated by reference in its entirety to the extent allowable by the law.

The circuit 400 comprises an upper portion comprising transistors 402A, 404A, each for example being an NMOS transistor, and which receive the input timing signals CP and CN respectively at their control nodes.

Transistor 402A is coupled in series with a resistor 406A between the supply voltage VDD and a node 408A. Transistor 404A is coupled in series with a resistor 410A between the supply voltage VDD and the node 408A. The node 408A is for example coupled to ground via a current source 412A. A node 414A between transistor 402A and resistor 406A provides a voltage signal $CN_{VDD}$ referenced to the supply voltage VDD. A node 416A between transistor 404A and resistor 410A provides a voltage signal $CP_{VDD}$ referenced to the supply voltage VDD.

The circuit 400 further comprises a lower portion comprising transistors 402B, 404B, each for example being a PMOS transistor, and which receive the input timing signals CP and CN respectively at their control nodes.

Transistor 402B is coupled in series with a resistor 406B between the ground voltage GND and a node 408B. Transistor 404B is coupled in series with a resistor 410B between the ground voltage and the node 408B. The node 408B is for example coupled to the supply voltage VDD via a current source 412B. A node 414B between transistor 402B and resistor 406B provides a voltage signal $CN_{GND}$ referenced to the ground voltage GND. A node 416B between transistor 404B and resistor 410B provides a voltage signal $CP_{GND}$ referenced to the ground voltage GND.

The circuit 400 further comprises a transistor 418, which is for example a PMOS transistor, coupled in series with a further transistor 420, which is for example an NMOS transistor. Transistors 418 and 420 each for example have one of their main current nodes, for example their drains, coupled together to an output node 422. The other main current node of transistor 418, for example its source, is coupled to receive the voltage signal $CN_{VDD}$ from node 414A. The control node of transistor 418 is coupled to receive the voltage signal $CP_{VDD}$ from node 416A. The other main current node of transistor 420, for example its source, is coupled to receive the voltage signal $CN_{GND}$ from node 414B. The control node of transistor 420 is coupled to receive the voltage signal $CP_{GND}$ from node 416B.

The output node 422 provides an output timing signal CLK, which in the example of FIG. 4 is used to control a track and hold circuit, but in alternative embodiments could be used to control other types of circuits such as a mixer. The track and hold circuit comprises a transistor 424, for example an NMOS transistor, coupled between an input node 426 and an output node 428 of the track and hold circuit. The input node 426 receives an input voltage $V_{IN}$ to be sampled. The output node 428 is coupled to ground via a capacitor 430, and provides an output voltage $V_{OUT}$.

The transistors 402A and 404B each have a further node, which could be a bulk node or a back gate node, connected to a positive output of a differential amplifier 432 for receiving a control voltage $V_{CTRLP}$. The transistors 404A and 402B each have a further node, which could be a bulk node or a back gate node, connected to a negative output of the differential amplifier 432 for receiving a control voltage $V_{CTRLM}$. The differential amplifier 432 for example generates the differential control voltages $V_{CTRLP}$ and $V_{CTRLM}$ based on a control voltage $V_{CTRL}$ applied across its positive and negative input terminals. While not illustrated in FIG. 4, the control voltage $V_{CTRL}$ is for example generated by circuitry similar to the voltage generation circuitry 108 and control block 110 of FIGS. 1A and 1B.

Operation of the circuit 400 will now be described in more detail with reference to FIG. 5.

Figure 5:
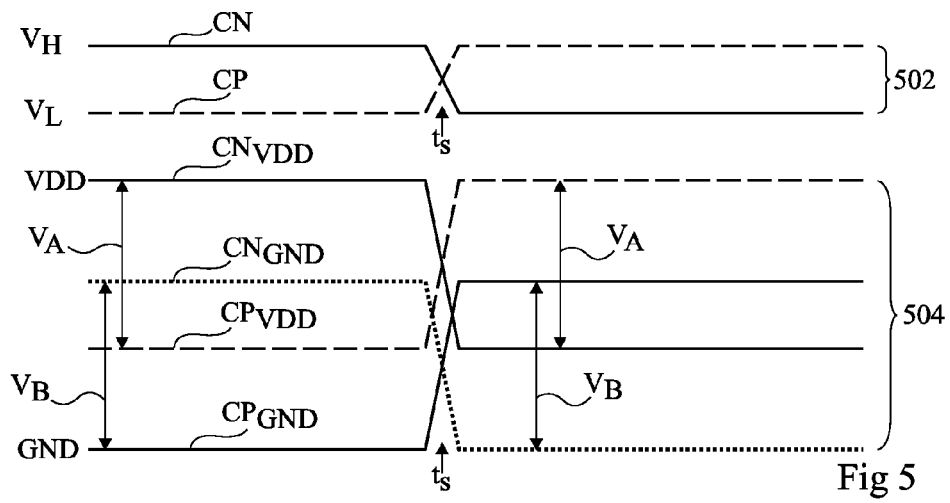
FIG. 5 is a timing diagram showing signals in the embodiment of FIG. 4 according to an example embodiment.

FIG. 5 illustrates a timing diagram 502 representing an example of the signals CN (shown by a solid line) and CP (shown by a dashed line). In the example of FIG. 5, the signal CN is initially at a high level $V_H$, while the signal CP is at a low level $V_L$. At a sampling time $t_s$, the signal CN goes from the level $V_H$ to the level $V_L$, the signal CP goes from the level $V_L$ to the level $V_H$. The difference between the levels $V_L$ and $V_H$ corresponds to the voltage swing of each of the differential input signals CP and CN. The common mode value of these signals is for example at a level halfway between the supply voltage VDD and ground voltage, for example at VDD/2.

FIG. 5 illustrates a further timing diagram 504 showing examples of the signals $CN_{VDD}$, $CN_{GND}$, $CP_{VDD}$ and $CP_{GND}$.

While the signal CN is high and the signal CP low, the signal $CN_{VDD}$ is for example at or close to the supply voltage VDD, and the signal $CP_{GND}$ is for example at or close to the ground voltage. The signal $CP_{VDD}$ is offset with respect to the supply voltage $V_{DD}$ by an offset value $V_A$. Similarly, the signal $CN_{GND}$ is offset with respect to the ground voltage GND by an offset value $V_B$. Indeed, while the input signal CP is low and the input signal CN is high, a relatively high proportion of the current of the current source 412A will be directed through the resistor 410A, and a relatively low proportion of the current of the current source 412A will be directed through resistor 406A. Similarly, a relatively high proportion of the current of the current source 412B will be directed through the resistor 406B, and a relatively low proportion of the current of the current source 412B will be directed through resistor 410B. Therefore, the voltage signal $CN_{VDD}$ will be at substantially the supply voltage level $V_{DD}$ and the voltage signal $CP_{GND}$ will be at substantially the ground voltage level. The voltage at node 416A will however be equal to the supply voltage VDD minus the voltage drop across the resistor 410A. Assuming that resistor 410A has a resistance R, the voltage at node 416A will therefore be equal to $VDD-RI_A$, where $I_A$ is the current flowing through transistor 404A as a function of the current of current source 412A and the relative levels of the differential signals CP, CN. Similarly, the voltage at node 414B will be equal to the ground voltage GND plus the voltage drop across the resistor 406B. Assuming that resistor 406B also has a resistance R, the voltage at node 414B will therefore be equal to $GND+RI_B$, where $I_B$ is the current flowing through transistor 402B as a function of the current of current source 412B and the relative levels of the differential signals CP, CN.

Thus, while the signal CP is low and the signal CN is high, the transistor 418 will see a gate source voltage $V_{GS}$ of $-V_A$, and will therefore be conducting. The transistor 420 on the other hand will see a $V_{GS}$ voltage of $-V_B$, and will thus be non-conducting. The voltage at the output node 422 will therefore be at substantially the level of $CN_{VDD}$, in other words at substantially the supply voltage VDD.

At the sampling time $t_s$ when the signal CN goes low and the signal CP goes high, the signal $CP_{VDD}$ changes to a level at or close to the supply voltage VDD, and the signal $CN_{GND}$ changes to a value at or close to the ground voltage GND. The signal $CN_{VDD}$ changes to a level offset with respect to the supply voltage $V_{DD}$ by the offset value $V_A$. Similarly, the signal $CP_{GND}$ changes to a level offset with respect to the ground voltage GND by the offset value $V_B$. Indeed, while the input signal CP is high and the input signal CN is low, a relatively high portion of the current of the current source 412A will be directed through the resistor 406A, and a relatively low proportion of the current of the current source 412A will be directed through resistor 410A. Similarly, a relatively high portion of the current of the current source 412B will be directed through the resistor 410B, and a relatively low proportion of the current of the current source 412B will be directed through resistor 406B. Therefore, the voltage signal $CP_{VDD}$ will be at substantially the supply voltage level VDD and the voltage signal $CN_{GND}$ will be at substantially the ground voltage level. The voltage at node 414A will however be equal to the supply voltage VDD minus the voltage drop across the resistor 406A. Assuming that resistor 406A has a resistance R, the voltage at node 414A will therefore be equal to $VDD-RI_A$, where $I_A$ is now the current flowing through transistor 402A as a function of the current of the current source 412A and the relative levels of the differential signals CP, CN. Similarly, the voltage at node 416B will be equal to the ground voltage GND plus the voltage drop across the resistor 410B. Assuming that resistor 410B also has a resistance R, the voltage at node 416B will therefore be equal to $GND+RI_B$, where $I_B$ is now the current flowing through transistor 404B as a function of the current of the current source 412B and the relative levels of the differential signals CP, CN.

Thus, while the signal CP is high and the signal CN is low, the transistor 418 will see a $V_{GS}$ voltage of $V_A$, and will therefore be non-conducting. The transistor 420 on the other hand will see a $V_{GS}$ voltage of $V_B$, and will thus be conducting. Thus the voltage at the output node 422 will be at substantially the level of $CN_{GND}$, in other words at substantially the ground voltage GND.

As it will be apparent to those skilled in the art, the level of current provided by the current sources 412A, 412B, and the resistance values of resistors 406A, 410A, 406B and 410B can be chosen to provide a differential gain of the differential signals $CP_{VDD}$, $CN_{VDD}$ and $CP_{GND}$, $CN_{GND}$ with respect to the differential signals CP, CN.

The resistance value R of each of the resistors 406A, 410A, 406B and 410B is for example in the range 100 to 1 k ohms.

Each of the offset values $V_A$ and $V_B$ is for example equal to between 0.4 V and 0.6 V.

The sampling time $t_s$ indicated in FIG. 5 can be time shifted by appropriate values of the control voltages $V_{CTRLP}$, $V_{CTRLM}$, in a similar manner to the other embodiments described above.

Figure 6:
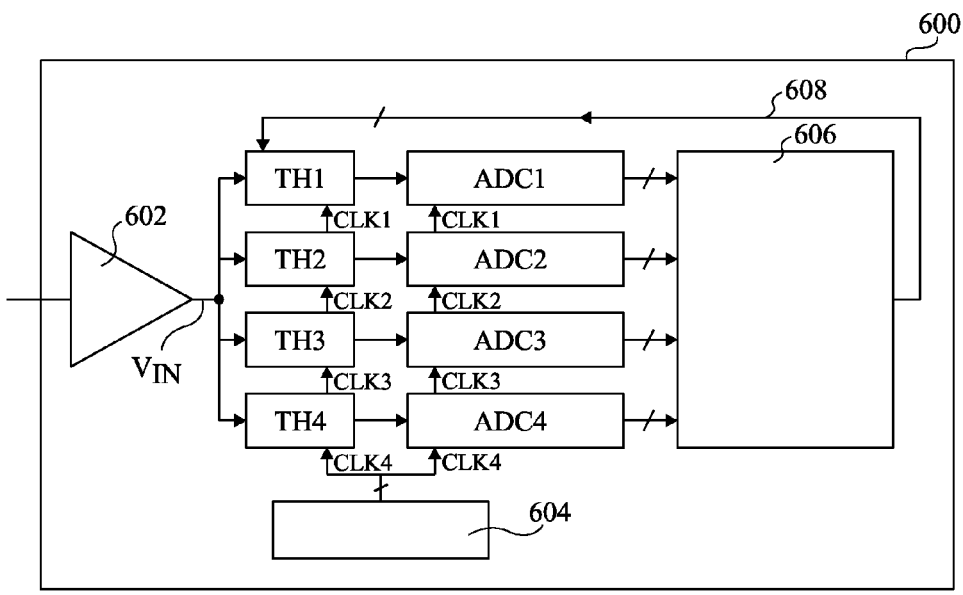
FIG. 6 schematically illustrates a time-interleaved analog to digital converter according to an embodiment of the present disclosure.

FIG. 6 illustrates an analog-to-digital converter (ADC) device 600 comprising circuitry as described in the embodiments above. In particular, the ADC device 600 is a time-interleaved ADC comprising four track and hold circuits TH1 to TH4, each for example comprising the circuitry of FIG. 1A, 1B, 3A or 4 described above. All of the circuits TH1 to TH4 receive a same input voltage signal $V_{IN}$ to be sampled, for example via an amplifier 602. Furthermore, each circuit TH1 to TH4 receives a corresponding timing signal CLK1 to CLK4 from a clock generation circuit 604. Each timing signal CLK1 to CLK4 may correspond to a single clock signal, or a pair of differential timing signals CP and CN. Each of these timing signals has a phase offset with respect to the others, such that the input voltage signal $V_{IN}$ is sampled at four times the sampling frequency of each circuit TH1 to TH4.

The output of each circuit TH1 to THN is coupled to a corresponding analog-to-digital converter ADC1 to ADC4, which also receive the corresponding timing signals CLK1 to CLK4. The digital outputs of these ADCs are coupled to a skew estimation block 606, which analyses the digital signals and generates a control voltage on lines 608 to be applied to the bulk node or back gate node of one or more transistors in each of the track and hold circuits TH1 to TH4.

The skew estimation block 606 for example comprises circuitry similar to the blocks 108 and 110 of FIGS. 1A and 1B described above. In some embodiments, the control voltages are generated by a digital analysis of the digital signals generated by the converters ADC1 to ADC4 to detect the skew, while in other embodiments, the control voltages are generated by first converting the digital signals into analog signals, and then performing an analog analysis of the signals to detect the skew.

While the example circuit of FIG. 6 comprises four track and hold circuits TH1 to TH4 and four converters ADC1 to ADC4, it will be apparent to those skilled in the art that in alternative embodiments there could be any number.

Figure 7:
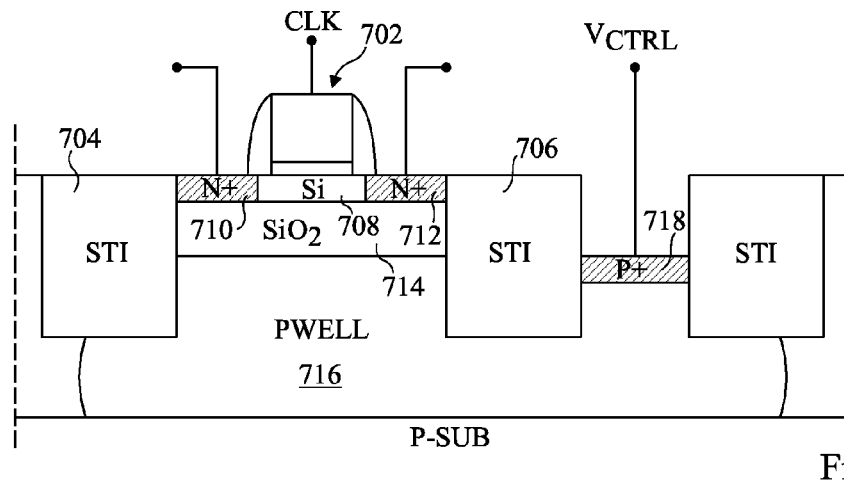
FIG. 7 is a cross-section view of a transistor according to an embodiment of the present disclosure.

FIG. 7 is a cross-section view of an NMOS transistor that is for example used to implement the transistor 102 of FIGS. 1A and 1B, the transistors 302A, 302B, 304A and/or 304B of FIG. 3A, and the transistors 402A, 404A, 402B and/or 404B of FIG. 4. It will be apparent to those skilled in art how the structure could be adapted to a PMOS implementation.

In the example of FIG. 7, the transistor has a fully-depleted silicon on insulator (FDSOI) structure. In particular, the transistor comprises a gate stack 702 formed over a thin film of silicon bordered on each side by isolation regions 704, 706, which are for example shallow trench isolations (STI). The silicon film for example has a thickness of between 5 and 10 nm. The silicon film comprises a central silicon region 708 directly under the gate stack 702 and forming a channel region, and heavily doped n-type regions 710 and 712 on each side of the region 708 forming the source and drain of the transistor. A layer of insulator 714 is formed under the silicon film and extends to the isolation regions 704, 706 on each side. Insulator layer 714 is for example a BOX (buried oxide) layer formed of $SiO_2$, and which for example has a thickness of between 20 and 30 nm.

A p-type well (PWELL) 716 is for example formed under the insulator layer 714, and provides a back gate of the device. A heavily doped p-type region 718 is for example formed adjacent to the isolation region 706 and contacts the PWELL 716. The region 718 forms the further node of the device that allows the PWELL 716 to be biased by the control voltage $V_{CTRL}$, or the voltage $V_{CTRLP}$ or $V_{CTRLM}$ in the case of the differential implementation of FIG. 3A or 4. It will be apparent to those skilled in the art that in alternative embodiments, the PWELL 716 and P+ region 718 could be replaced by an NWELL and an N+ region in either an NMOS or PMOS implementation.

An advantage of the FDSOI structure of FIG. 7 is that a relatively broad range of levels of the control voltage $V_{CTRL}$ can be applied to the transistor. Indeed, while a more classical MOS transistor with a bulk structure and without the insulator layer 714 would have a limited range of biasing voltages that could be applied to its bulk node, for example typically of around ±0.3 V in the case of an NMOS device, a structure having an insulator layer under the channel region can be biased by up to ±2VDD, in other words up to twice the supply voltage VDD. Thus a greater threshold voltage variation can be applied as compared to the case of a more classical MOS device.

An advantage of the embodiments described herein is that skew correction can be applied to a transistor in a simple fashion without modifying the timing signal applied to the gate of the transistor, and therefore without the risk of introducing jitter on the timing signal.

Having thus described at least one illustrative embodiment of the invention, various alterations, modifications and improvements will readily occur to those skilled in the art.

For example, while in the circuits represented in the various figures, the high and low supply voltages are at VDD and ground, it will be apparent that any suitable voltages could be used, which may depend on the transistor technology.

Furthermore, it will be apparent to those skilled in the art that the transistors represented as p-channel MOS transistors could be replaced in alternative embodiments by re-channel MOS transistors, and vice versa. Furthermore, the various transistors could be implemented in alternative transistor technologies rather than MOS, such as bipolar.

Furthermore, it will be apparent to those skilled in the art that the various features of the embodiments described herein could be recombined, in alternative embodiments, in any combination.

The invention claimed is:

1. A circuit comprising:
 a first transistor having first and second conduction nodes,
  a control node configured to receive a first timing signal for causing the first transistor to transition between conducting and non-conducting states, and a bulk node;
 a biasing circuit coupled to said bulk node of said first transistor; and
 a control circuit configured to
  receive at least one feedback signal during application of at least one initial control voltage to said bulk node, and
  control said biasing circuit to apply a first control voltage to said bulk node to adjust the timing of the transition, the controlling being based on the at least one feedback signal.

2. The circuit of claim 1, wherein the first transistor includes a back control node and has an semiconductor on insulator (SOI) structure; and wherein said bulk node is coupled to a said back control node of said first transistor.

3. The circuit of claim 2, wherein said first transistor comprises a layer of insulator, and a semiconductor layer isolated from said back control node by said a layer of insulator.

4. The circuit of claim 1, further comprising a capacitor coupled to said second conduction node; and wherein the first conduction node is configured to define an input node of a track and hold circuit.

5. The circuit of claim 1, further comprising a second transistor having first and second conduction nodes, a control node configured to receive a second timing signal for causing the second transistor to transition between conducting and non-conducting states, and a bulk node; wherein the first and second timing signals comprise differential signals; wherein said biasing circuit is coupled to said bulk further node of said second transistor; and wherein said control circuit is further configured to control said biasing circuit to apply a second control voltage to said bulk further node of said second transistor to adjust the timing of the transition of the second transistor.

6. The circuit of claim 5, further comprising a current source; wherein the first conduction nodes of said first and second transistors are coupled to said a current source; further comprising a third transistor having
 a first conduction node coupled to a said second conduction node of the first transistor, and
 a control node coupled to the second conduction of the second transistor, the control node of said third transistor further receiving an input signal to be sampled.

7. The circuit of claim 5, further comprising:
 a fourth transistor having a first conduction node coupled to a first voltage signal, a control node coupled to a second voltage signal, and a second conduction node coupled to an output node; and
 a fifth transistor having a first conduction node coupled to a third voltage signal, a control node coupled to a fourth voltage signal, and a second conduction node coupled to said output node,
 said first and second transistors configured to generate said first and second voltage signals, said first and second voltage signals being both referenced to a first supply voltage, said third and fourth voltage signals being both referenced to a second supply voltage.

8. The circuit of claim 7, wherein said first and second transistors are configured to:
 generate said first voltage signal by offsetting said first supply voltage by an amount based upon the first and second timing signals; and
 generate said second voltage signal by offsetting said first supply voltage by an amount based upon said first and second timing signals.

9. The circuit of claim 8, further comprising:
 a first branch configured to said first voltage signal and comprising a resistor coupled to said first supply voltage and in series with said first transistor; and
 a second branch configured to generate said second voltage signal and comprising a resistor coupled to said first supply voltage and in series with said second transistor.

10. The circuit of claim 7, wherein each of said first and second timing signals has a voltage swing of less than 0.6 V.

11. The circuit of claim 7, wherein each of said first and second timing signals each has a first voltage swing; and wherein an output signal generated at said output node has a second voltage swing greater than said first voltage swing.

12. The circuit of claim 1, wherein the control circuit is configured to control said biasing circuit to generate the first control voltage to have a constant level to adjust the timing of the transition by a first amount.

13. The circuit of claim 12, wherein said control circuit is configured to control, based on at least one feedback signal received by the control circuit during application of at least one initial control voltage to said bulk node; and wherein the biasing circuit is configured to generate said constant level of the first control voltage.

14. A method of modifying timing of at least one of a plurality of transitions between conducting and non-conducting states of a first transistor having first and second conduction nodes, a control node, and a bulk node, the method comprising:
 applying to the control node of said first transistor a first timing signal for causing the first transistor to transition between the conducting and non-conducting states; and
 controlling, by a control circuit, a biasing circuit to apply a first control voltage to said bulk node to adjust the timing of the at least one of said plurality of transitions of the first transistor, the controlling being based upon at least one feedback signal received by the control circuit during application of at least one initial control voltage to said bulk node.

15. The method of claim 14, wherein controlling the biasing circuit to apply the first control voltage comprises controlling the biasing circuit to generate the first control voltage to have a constant level to adjust the timing of the at least one of said plurality of transitions by a first amount.

16. The method of claim 15, wherein the biasing circuit is configured to generate said constant level of the first control voltage.

17. A circuit comprising:
a first transistor having first and second conduction nodes, a control node configured to receive a first timing signal for causing the first transistor to transition between conducting and non-conducting states, and a bulk node;
a biasing circuit coupled to the bulk node of said first transistor;
a second transistor having first and second conduction nodes, a control node configured to receive a second timing signal for causing the second transistor to transition between conducting and non-conducting states, and a bulk node coupled to said biasing circuit, the first and second timing signals comprising differential signals; and
a control circuit configured to
receive at least one feedback signal during application of at least one initial control voltage to said bulk node,
control said biasing circuit to apply a first control voltage to said bulk node to adjust the timing of the transition, the controlling being based on the at least one feedback signal, and
control said biasing circuit to apply a second control voltage to said bulk node of said second transistor to adjust the timing of the transition of the second transistor.

18. A circuit comprising:
a first transistor having first and second conduction nodes, a control node configured to receive a first timing signal for causing the first transistor to transition between conducting and non-conducting states, and a bulk node;
a biasing circuit coupled to said bulk node of said first transistor; and
a control circuit configured to
receive at least one feedback signal during application of at least one initial control voltage to said bulk node,
control said biasing circuit to apply a first control voltage to said bulk node to adjust the timing of the transition, the controlling being based on the at least one feedback signal, and
control said biasing circuit to generate the first control voltage to have a constant level to adjust the timing of the transition by a first amount.

19. A method of modifying timing of at least one of a plurality of transitions between conducting and non-conducting states of a first transistor having first and second conduction nodes, a control node, and a bulk node, the method comprising:
applying to the control node of said first transistor a first timing signal for causing the first transistor to transition between the conducting and non-conducting states; and
controlling, by a control circuit, a biasing circuit to apply a first control voltage to said bulk node to adjust the timing of the at least one of said plurality of transitions of the first transistor, the controlling being based upon at least one feedback signal received by the control circuit during application of at least one initial control voltage to said bulk node, the controlling comprising operating the biasing circuit to generate the first control voltage to have a constant level to adjust the timing of the at least one of said plurality of transitions by a first amount.

* * * * *

UNITED STATES PATENT AND TRADEMARK OFFICE
CERTIFICATE OF CORRECTION

Page 1 of 1

PATENT NO.         : 9,000,963 B2
APPLICATION NO.    : 14/293119
DATED              : April 7, 2015
INVENTOR(S)        : Singh et al.

It is certified that error appears in the above-identified patent and that said Letters Patent is hereby corrected as shown below:

In the Claims

Column 11, Line 51    Delete: "to a said"
                      Insert: --to said--

Column 11, Line 54    Delete: "said a layer"
                      Insert: --said layer--

Column 11, Line 65    Delete: "bulk further node"
                      Insert: --bulk node--

Column 12, Line 1     Delete: "bulk further node"
                      Insert: --bulk node--

Column 12, Line 6     Delete: "said a current"
                      Insert: --said current--

Column 12, Line 8     Delete: "to a said"
                      Insert: --to said--

Column 12, Line 36    Delete: "configured to said"
                      Insert: --configured to generate said--

Signed and Sealed this
Fifteenth Day of September, 2015

Michelle K. Lee
*Director of the United States Patent and Trademark Office*